United States Patent
Yao

(10) Patent No.: US 8,461,886 B1
(45) Date of Patent: Jun. 11, 2013

(54) CIRCUIT AND CIRCUIT METHOD FOR REDUCTION OF PFD NOISE CONTRIBUTION FOR ADPLL

(75) Inventor: Chih-Wei Yao, Milpitas, CA (US)

(73) Assignee: Marvell International Ltd. (BM)

( * ) Notice: Subject to any disclaimer, the term of this patent is extended or adjusted under 35 U.S.C. 154(b) by 0 days.

(21) Appl. No.: 13/277,505

(22) Filed: Oct. 20, 2011

Related U.S. Application Data

(60) Provisional application No. 61/405,135, filed on Oct. 20, 2010, provisional application No. 61/405,142, filed on Oct. 20, 2010.

(51) Int. Cl.
*H03L 7/06* (2006.01)

(52) U.S. Cl.
USPC .......................................... 327/156; 327/147

(58) Field of Classification Search
USPC ................................. 327/147, 156
See application file for complete search history.

(56) References Cited

U.S. PATENT DOCUMENTS

| | | | | |
|---|---|---|---|---|
| 4,484,091 A | * | 11/1984 | Nagano | 326/52 |
| 5,157,354 A | * | 10/1992 | Saiki et al. | 331/1 A |
| 5,404,250 A | * | 4/1995 | Hase et al. | 360/51 |
| 5,629,650 A | * | 5/1997 | Gersbach et al. | 331/17 |
| 6,940,323 B2 | * | 9/2005 | Katoh et al. | 327/156 |
| 7,403,073 B2 | * | 7/2008 | Kossel et al. | 331/16 |
| 7,839,221 B2 | * | 11/2010 | Kossel et al. | 331/16 |
| 2004/0061536 A1 | * | 4/2004 | Katoh et al. | 327/156 |
| 2007/0075785 A1 | * | 4/2007 | Kossel et al. | 331/16 |
| 2008/0246522 A1 | * | 10/2008 | Kossel et al. | 327/159 |
| 2010/0097150 A1 | * | 4/2010 | Ueda et al. | 331/25 |
| 2010/0277244 A1 | * | 11/2010 | Chang et al. | 331/16 |
| 2010/0283654 A1 | * | 11/2010 | Waheed et al. | 341/166 |
| 2011/0090998 A1 | * | 4/2011 | Zhang | 375/365 |
| 2011/0099450 A1 | * | 4/2011 | Chang et al. | 714/752 |
| 2012/0133405 A1 | * | 5/2012 | Jain et al. | 327/159 |

* cited by examiner

*Primary Examiner* — Adam Houston

(57) ABSTRACT

A PLL includes a PFD configured to: receive a reference clock and a feedback clock, output a first signal, which includes first phase information for a rising edge of the reference clock, and output a second signal, which includes second phase information for a rising edge of the feedback clock. The PLL includes a logic gate coupled to the PFD configured to logically combine the first and second signals to produce a pulse signal having a rising edge, which includes the first phase information, and having a falling edge, which includes the second phase information. The PLL includes a TDC coupled the logic gate configured to generate a digital timing signal, which includes timing information for a phase difference of the first and second phase information. The PLL includes a controlled oscillator coupled to the TDC configured to vary a frequency of the feedback clock from the digital timing signal.

29 Claims, 13 Drawing Sheets

CIRCUIT AND CIRCUIT METHOD FOR REDUCTION OF PFD NOISE CONTRIBUTION FOR ADPLL

CROSS REFERENCE TO RELATED APPLICATIONS

This application claims the benefit of, and priority to, U.S. Provisional Patent App. No. 61/405,135, filed Oct. 20, 2010, titled "Reduction of PFD Noise Contribution for ADPLL," of Yao, and U.S. Provisional Patent App. No. 61/405,142, filed Oct. 20, 2010, titled "Low Noise, High Linearity Phase Detector," of Yao, both of which are incorporated herein by reference in their entireties for all purposes.

BACKGROUND

Embodiments described herein generally relate to phase locked loops (PLLs), and more particularly embodiments described herein relate to PLLs having phase frequency detectors (PFDs) with low noise.

Unless otherwise indicated herein, the circuit and the circuit methods described in the background section are not prior art to the claims in this application and are not admitted to be prior art by inclusion in the background section.

A PLL is a control circuit configured to generate an output signal where a phase of the output signal is either in phase with a reference signal or otherwise has a fixed phase relationship with the reference signal. The reference signal is typically a clock signal, which may be generated by a crystal oscillator or the like.

In general a PLL includes a phase detector and a voltage controlled oscillator (VCO), which generates an output signal of the PLL. The phase detector is configured to detect a phase difference between the reference signal and a feedback signal (feedback of the output signal of the PLL) from the VCO. The phase detector then generates one or more output signals to drive the VCO to increase, decrease, or maintain the frequency of the output signal generated by the VCO so that the phase difference between of the reference signal and the feedback signal is zero or some other constant value, i.e., matched phase. That is, the output signals of the phase detector are used to control the VCO via a feedback loop.

Because the phase of the output signal generated by the VCO is matched with the phase of the reference signal, PLLs may be used in a variety of applications (e.g., signal demodulation) to track an input signal having an input frequency. Further, because of the foregoing described feature, PLLs are often used as frequency synthesizers to generate an output signal having a frequency that is a multiple of the reference signal. A synthesized signal may have a frequency that is a fraction of the frequency of the reference signal or may be many gigahertz.

PLLs have found wide spread use in a number of fields including wireless communications (e.g., radio frequency communications), telecommunications, computer networking, and other electronic applications. While PLLs have found wide spread use in a number of fields, PLL manufacturers continue to strive to develop improved PLLs having reduced noise and improved efficiency.

SUMMARY

Embodiments described herein generally relate to phase locked loops (PLLs), and more particularly embodiments described herein relate to PLLs having phase frequency detectors (PFDs) with low noise.

According to one specific embodiment, a PLL includes a phase frequency detector (PFD) configured to: receive a reference clock signal and a feedback clock signal, output a first signal, which includes first phase information for a rising edge of the reference clock signal, and a second signal, which includes second phase information for a rising edge of the feedback clock signal. The PLL further includes a logic gate coupled to the PFD and configured to logically combine the first signal and the second signal to produce a pulse signal having a rising edge, which includes the first phase information, and a falling edge, which includes the second phase information. The PLL further includes a time to digital converter (TDC) coupled the logic gate and configured to generate a digital timing signal, which includes timing information for a phase difference of the first and the second phase information. The PLL further includes a controlled oscillator coupled to the TDC and configured to vary or maintain a frequency of the feedback clock signal from the digital timing signal. According to a specific embodiment, the controlled oscillator is a current controlled oscillator, a voltage controlled oscillator, and or a digital controlled oscillator.

According to a specific embodiment, the PLL further includes a feedback loop configured to transfer the feedback clock signal varied or maintained by the controlled oscillator to the PFD. The PLL may include a frequency divider configured to frequency device the feedback clock signal, and the PFD is configured to receive the feedback clock signal from the divider.

According to another specific embodiment, the logic gate includes an inverter and an AND gate and is configured to remove falling edges of the first signal and the second signal from the pulse where the falling edges of the first signal and the second signal include jitter. According to one embodiment, an input of the inverter is configured to receive the reference clock signal. A first input of the AND gate is configured to receive the reference clock signal and an output of the inverter is coupled to a second input of the AND gate. A logic function of the logic gate generates a logic one signal if the reference clock signal is a logic one signal and the feedback clock signal is a logic zero signal, otherwise the logic function generates a logic zero signal.

According to another specific embodiment, the PFD includes: a first flip flop configured to receive the reference clock signal and output the first signal, and a second flip flop configured to receive the feedback clock signal and output the second signal. The resets of the first flip flop and the second flip flop are configured to be reset by a logical combination of the first signal and the second signal after a delay to reduce a dead zone of the PLL. The PFD may further include an AND gate configured to perform the logical combination of the first signal and the second signal. The PFD may further include a delay circuit configured to delay transfer of the logical combination of the first signal and the second signal to the resets. Applicant particularly points out that the foregoing describes one specific embodiment of a PFD according to one specific embodiment of the present invention. PFDs may be alternatively made and various embodiments of the present invention may include such alternatively made PFDs.

According to another embodiment of the present invention, a PLL includes a phase frequency detector (PFD) configured to: receive a reference clock signal and a feedback clock signal, output a first signal, which includes first phase information for a rising edge of the reference clock signal, and a second signal, which includes second phase information for a rising edge of the feedback clock signal. The PLL further includes first multiplexer configured to receive the reference clock signal and receive the first signal from the PFD, and a second multiplexer configured to receive the feedback clock signal and receive the second signal from the PFD. The PLL further includes a control gate configured to control the first multiplexer and the second multiplexer to pass the reference clock signal and the feedback clock signal or pass the first signal and the second signal. The PLL further includes a logic gate configured to receive either the reference clock signal and the feedback clock signal if the PLL is not locked or receive the first signal and the second signal from the first multiplexer and the second multiplexer if the PLL is locked. The logic gate is configured to perform a logical function on either the reference clock signal and the feedback clock signal to generate a first pulse or the first signal and the second signal to generate a second pulse. The first pulse includes first phase difference information for the phase difference between the reference clock signal and the feedback clock signal. The second pulse includes second phase difference information for the phase difference between the first phase information and the second phase information.

According to a specific embodiment, the logical function is an AND function. The logic gate may include an inverter and an AND gate configured to perform the logical function. The inverter is configured to invert the reference clock signal or the second signal prior to transferring the reference clock signal or the second signal prior to a first input of the AND gate, and a second input of the AND gate is configured to receive either the reference clock signal or the first signal, and perform a AND function on either the reference clock signal and the feedback clock signal or the first signal and the second signal. According to another specific embodiment, the logical function generates a logic one state if the reference clock or the first pulse is one and the feedback clock signal is a logic state zero. An input of the inverter is configured to receive the feedback clock signal or the first pulse. A first input of the AND gate is configured to receive the reference clock signal or the second pulse. An output of the inverter is coupled to a second input of the AND gate.

According to another specific embodiment, the first pulse does not include phase information for falling edges of the reference clock signal and the feedback clock signal, and the second pulse does not include phase information for falling edges of the first and the second signals.

According to another specific embodiment, the control gate is a flip flop and is configured to transfer a control signal to the first mux and the second mux on a falling edge of the feedback clock signal to control.

According to another specific embodiment, the PLL further includes a phase lock detector configured to determine if the PLL is locked and set the control signal to a first control state if the PLL is locked and set the control signal to a second control signal is the PLL is not locked. The first multiplexer and the second multiplexer are configured to receive the control signal in the first state to pass the first signal and the second signal to the logic gate. The first multiplexer and the second multiplexer are configured to receive the control signal in the second state to pass the reference clock signal and the feedback clock signal to the logic gate. The first multiplexer and the second multiplexer are configured as bypass circuits for the PFD with the control signal in the first state.

According to another specific embodiment, the PLL further includes an edge-triggered, set-reset flip flop configured to be set and reset and transfer a set signal or a reset signal to the logic gate to either allow logical combinations or force an output of the logic gate low to remove from the output phase information for the logical combination of the reference clock signal and the feedback clock or for the logical combination of the first signal and the second signal. The phase information removed is for the falling edges of the reference clock signal and the feedback clock or for the falling edges of first signal and the second signal.

According to another specific embodiment, the PFD is configured to rectify negative phase information passed from the logic gate. The PLL may further include a coarse time to digital converter (TDC) to add negative phase information for the logic gate. The coarse TDC is configured to be turned off if the PLL is locked. The PLL may further include a fine TDC coupled to the PFD, and an adder configured to combine output from the coarse TDC and the fine TDC to add positive phase information from the fine TDC and negative phase information from the coarse TDC.

The following detailed description and accompanying drawings provide a more detailed understanding of the nature and advantages of the present invention.

DETAILED DESCRIPTION

Embodiments described herein generally provide a phase locked loop (PLL), and more particularly embodiments described herein provide a PLL having a phase frequency detector (PFD) with low noise.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

A PLL is a control circuit configured to generate an output signal where a phase of the output signal is either in phase with a reference signal or otherwise has a fixed phase relationship with respect to the reference signal. The reference signal is typically a clock signal, which may be generated by a crystal oscillator or the like. PLLs find use in a variety of applications and fields. Various application for which PLLs are used include carrier recovery, clock recovery, tracking filters, frequency and phase demodulation, frequency synthesis, and the like. Various fields in which PLLs are used include communications (e.g., wireless communications, telecommunication, data communications, etc.), data storage, noise cancellation, television, etc.

Figure 1:
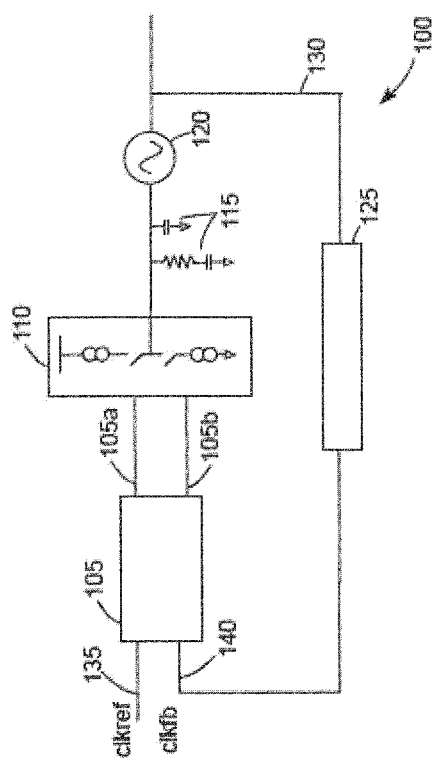
FIG. 1 is a simplified schematic of a traditional PLL.

FIG. 1 is a simplified schematic of a traditional PLL 100. PLL 100 includes a phase frequency detector (PFD) 105, a charge pump 110, a filter circuit 115, a voltage controlled oscillator (VCO) 120, a divider 125, a reference clock input 135, a feedback circuit path 140, and a feedback clock input 141. PFD 105 includes the reference clock input 135, which is configured to receive a reference clock signal (labeled as clkref in FIG. 1). The reference clock signal may be a relatively low frequency signal (e.g., in the less than 100 megahertz) and may be generated by a crystal oscillator or the like. PFD 105 also includes the feedback clock input 141 configured to receive a feedback clock signal (labeled as clkfb in FIG. 1) from feedback-circuit path 140. The PFD is configured to detect a phase difference and a frequency difference between the reference clock signal and the feedback clock signal. The PFD includes two outputs, an up output 105a and a down output 105b. Up output 105 a is configured to output an up pulse having a width proportional to the phase difference between the reference clock signal and the feedback clock signal and is configured to direct the VCO to increase the output frequency to place the feedback clock signal in phase with the reference clock signal. The down output is configured to output a down pulse having a width also proportional the phase difference between the reference clock signal and the feedback clock signal and is configured to direct the VCO to decrease the output frequency to place the feedback clock signal in phase with the reference clock signal. The charge pump is configured to receive the up signal and the down signal from the PFD and amplify one of the up signal and down signal for transfer to the VCO. Filter circuit 115 is configured to filter noise from the signals transferred from the charge pump to the VCO. The VCO is configured to receive the output of the charge pump and increase, decrease, or maintain the frequency of the output signal, which is output from the PLL and is fed back through the feedback-circuit path 130 to the feedback clock input 140 of the PFD. Divider 125 is configured to divide the frequency of the feedback clock signal received from the VCO before the feedback clock signal is transferred from the feedback circuit path 140 to the feedback clock input 140. Charge pump 110, as well as other circuit in the PLL, generates noise in the output signal. One benefit of select embodiment of the present invention is to reduce any noise that is generated by a charge pump by replacing the charge pump with alternative circuits, such a time to digital converter (TDC).

Figure 2:
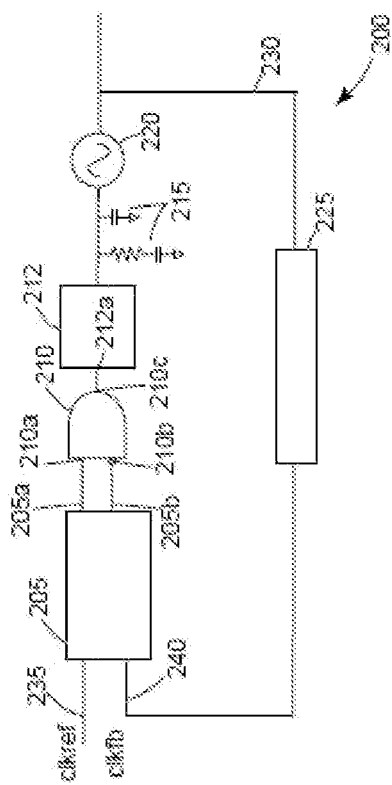
FIG. 2 is a simplified schematic of a PLL 200 according to one embodiment of the present invention.

FIG. 2 is a simplified schematic of a PLL 200 according to one embodiment of the present invention. PLL 200 includes a PFD 205, AND gate 210 with an inverted input, a TDC 212, a filter circuit 215, a voltage controlled oscillator (VCO) 220, a divider 225, a reference clock input 235, and a feedback clock input 240. PFD 205 includes the reference clock input 235, which is configured to receive a reference clock signal. The reference clock signal may be a relatively low frequency signal (e.g., less than 100 megahertz) and may be generated by a crystal oscillator or the like. PFD 205 also includes the feedback clock input 241 configured to receive a feedback clock signal from feedback-circuit path 240. The PFD is configured to detect a phase difference and a frequency difference between the reference clock signal and the feedback clock signal. The PFD includes two outputs, an up output 205a and a down output 205b, which are configured to output an up signal and a down signal, respectively. The up signal and the down signal are explained below.

AND gate 210 includes a first input 210a coupled to up output 205a of PFD 205. AND gate 210 also includes a second inverted input 210b coupled to down output 205b of PFD 210. The AND gate is configured to perform the logical AND function on the up signal and the down signal generated by the PFD. It will be understood by those of skill in the art that AND gate 210 may be constructed by a variety of basic logic circuits. The AND gate includes an output 210c that is coupled to a TDC input 212a of TDC 212. Combining the up output 205a and inverted down output 205b with the AND gate 210, noise generated by the PFD reset path can be removed (see FIG. 4A). The output 210c of the AND gate 210 is input to the TDC as a TDC enable signal. The TDC is configured to generate a signal that is transmitted to the VCO for controlling the VCO's output signal.

Figure 3:
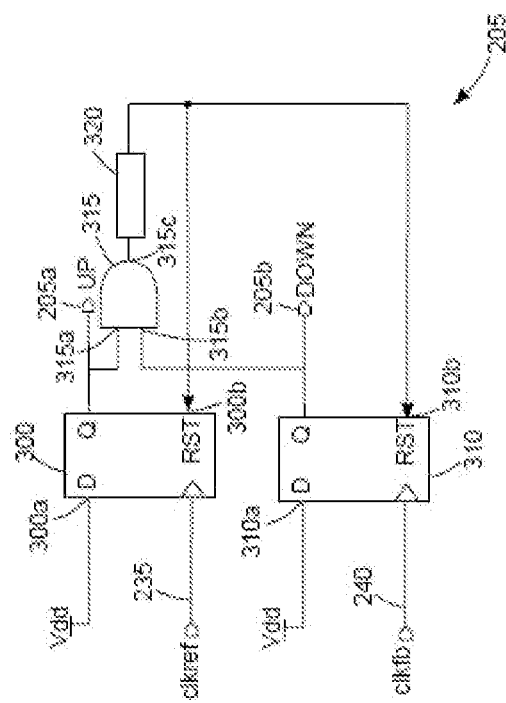
FIG. 3 is a simplified schematic of PFD according to one embodiment of the present invention.

FIG. 3 is a simplified schematic of PFD 205 according to one embodiment of the present invention. PFD 205 includes a reference-clock flip flop 300 configured to receive the reference clock signal via reference clock input 235. PFD 205 also includes a feedback-clock flip-flop 310 configured to receive the feedback clock signal via feedback clock input 241.

The D inputs 300a and 310b of both the respective reference-clock flip flop 300 and the feedback-clock flip-flop 310 are tied to Vdd so that the reference clock signal and the feedback clock signals pass through the reference-clock flip flop and the feedback-clock flip-flop, respectively. The reference clock signal is configured to pass to up output 205a and the feedback clock signal is configured to pass to down output 205b. The reference clock signal is referred to herein as the "up signal" after having passed through the reference clock flip flop, and the feedback clock signal is referred to herein as the "down signal" after having passed through the feedback clock flip flop. PFD 205 includes an AND gate 315 configured to receive the up signal via a first input 315a from the up output and receive the down signal via a second input 315b from the down output. AND gate 315 is configured to perform the logical AND function on the up signal and the down signal. The "ANDed" result of the up signal and the down signal are output from the AND gate via the AND gates output 315c. PFD includes a delay circuit 320 (e.g., a series of inverters) coupled to output 315c of AND gate 315 is configured to receive the ANDed result of the up signal and the down signal. The delay circuit is configured to delay the ANDed result before passing the ANDed results to the resets 300b and 310b of the reference-clock flip flop and the feedback-clock flip flop, respectively. If the up signal and the down signal are both high, the AND gates passes a high to the resets of the reference clock flip flop and the feedback clock flip flop to drive the up signal and the down signal both low.

The rising edge of the up signal is triggered by the rising edge of the reference clock signal, and the rising edge of the down signal is triggered by the rising edge of the feedback clock signal. Because the rising edge of the up signal is triggered by the rising edge of the reference clock signal, and the rising edge of the down signal is triggered by the rising edge of the feedback clock signal, the up signal and the down signal include the phase difference information for the reference clock signal and the feedback clock signal. The "ANDed" result of the up signal and the down signal includes phase difference information for the reference clock signal and the feedback clock signal. More specifically, if the up signal and the down signal are both high, both the reference-clock flip flop and the feedback-clock flip flop are reset to low after the delay introduced by delay circuit 320. The delay provided by the delay circuit prior to reset removes any charge-pump dead zone and generally tends to improve the linearity of the PFD (e.g., for a fractional-N PLL). If one or both of the up signal and the down signal are low, the reset is de-asserted and the reference-clock flip flop and the feedback-clock flip flop are configured to pass the reference clock signal and the feedback clock signal to the up output and the down output.

Figure 4A:
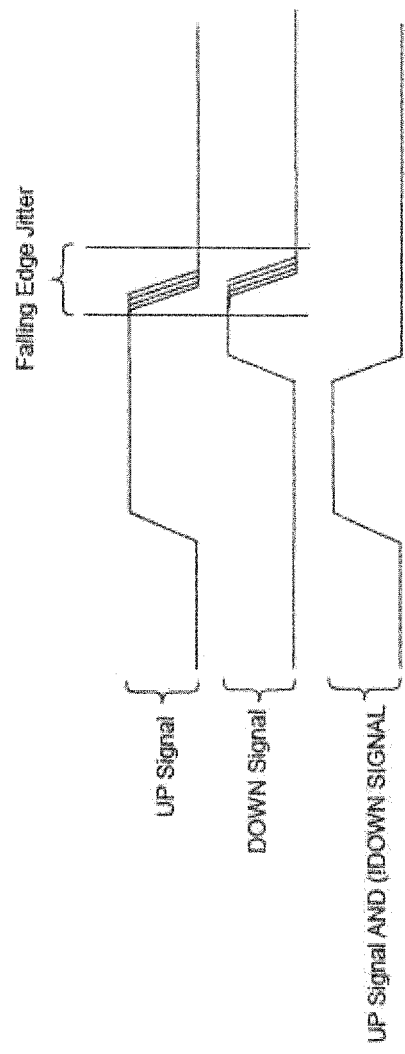
FIG. 4A is a simplified timing diagram of an up signal, a down signal, and an output signal ("ANDed" signal) of the AND gate of the PLL.

FIG. 4A is a simplified timing diagram of an up signal, a down signal, and an output signal of the AND gate. The output signal from the AND gate is controlled by the ANDed combination of the up signal and the down signal, and is controlled by the resets of the feedback clock flip flop and the feedback clock flip flop. The shaping of the output signal by the resets of the feedback clock flip flop and the feedback clock flip flop is described above for decreasing the dead zone of the PLL. The difference between the rising edge of the output signal and the falling edge of the output signal represents the phase difference of the reference clock signal and the feedback clock signal. That is, the AND gate extracts the phase difference information from the up signal and the down signal and puts the phase difference into the falling edges and rising edges of the output signal.

Figure 4B:
FIG. 4B is a timing diagram of a single clock pulse with a rising edge and a falling edge where a first type of TDC is configured to generate a digital-timing signal representing the time difference between the rising edge and the falling edge.
Figure 4C:
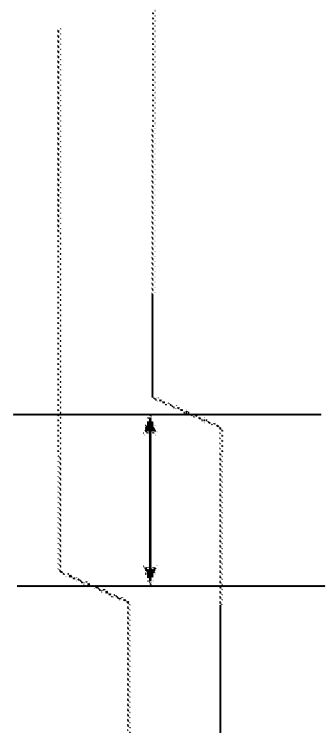
FIG. 4C is a timing diagram of two rising edges of a signal where a second type of TDC is configured to generate a digital-timing signal representing the time difference between the two rising edges.

According to one embodiment, TDC 212 is configured to generate a digital-timing signal representing the difference between two edges of the output signal output from the AND gate. One specific type of TDC (a "first" type of TDC) is configured to generate a digital-timing signal for a rising edge and a falling edge of a signal, such a clock signal. FIG. 4B is a timing diagram of a single clock pulse with a rising edge and a falling edge where the first type of TDC is configured to generate a digital-timing signal representing the time difference between the rising edge and the falling edge of the single clock pulse. Another specific type of TDC (a "second" type of TDC) is configured to generate a digital-timing signal for two rising edges, where the first rising edge is a start signal and the second rising edge is a stop signal. FIG. 4C is a timing diagram of two rising edges of a signal where the second type of TDC is configured to generate a digital-timing signal representing the time difference between the two rising edges.

The falling edges of both the up signal and the down signal may include jitter as shown in FIG. 4A. The second type of TDC described above would typically generate a relatively accurate timing-difference signal for a signal having a falling edge that jitters because the second type of TDC is not configured to determine a timing-difference signal from falling edges. The first type of TDC (e.g., TDC 212) described above might generate relatively less accurate timing-difference signal from a signal having falling edges that jitter because the first type of TDC determine a timing-difference signal from both a rising edge and a falling edge.

As described above, the rising edges of the up signal and the down signal represent the rising edges of the reference clock signal and the feedback clock signal respectively and include the phase difference information between the rising edges of the reference clock signal and the feedback clock signal. The logical combination (e.g., a AND logical combination) of the rising edges of the up signal and the down signal removes the falling edges of the up signal and the down signal and removes the jitter of the falling edges of the ANDed signal (also referred to in FIG. 3 as the output signal of the AND gate). The ANDed signal is transferred to TDC 212 (e.g., the first type of TDC) where the TDC may generate a relatively accurate timing-difference signal (i.e., phase difference signal), which does not include jitter because the logical combination of the up signal and the down signal causes the jitter in the falling edges to be removed the AND signal.

The timing-difference signal generated by the TDC from the logical combination (e.g., the ANDed logical combination) of the rising edges of the up signal and the down signal is transferred to the VCO to adjust, or maintain, the frequency of the feedback clock signal to provide that the phases of the reference clock signal and the feedback clock signal may be locked and/or the frequencies of the reference clock signal and the feedback clock signal may be made equal (i.e., a step in achieving lock). PLL 200 provides that AND gate 210 and TDC 212 may replace a change pump included in some traditional PLLs and provide a relatively clean (non-jittering) timing-difference signal to a VCO. According to an alternative PLL embodiment, the alternative PLL may include a charge pump, and AND gate 210 and TDC 212 provide a relatively clean (non-jittering) timing-difference signal to the charge pump where the charge pump there after transferred the amplified signal to the VCO. It is noted that while PLL 200 is shown in FIG. 2 as not including a charge pump, the above described alternative embodiment of PLL 200 may include a charge pump as described.

Figure 5:
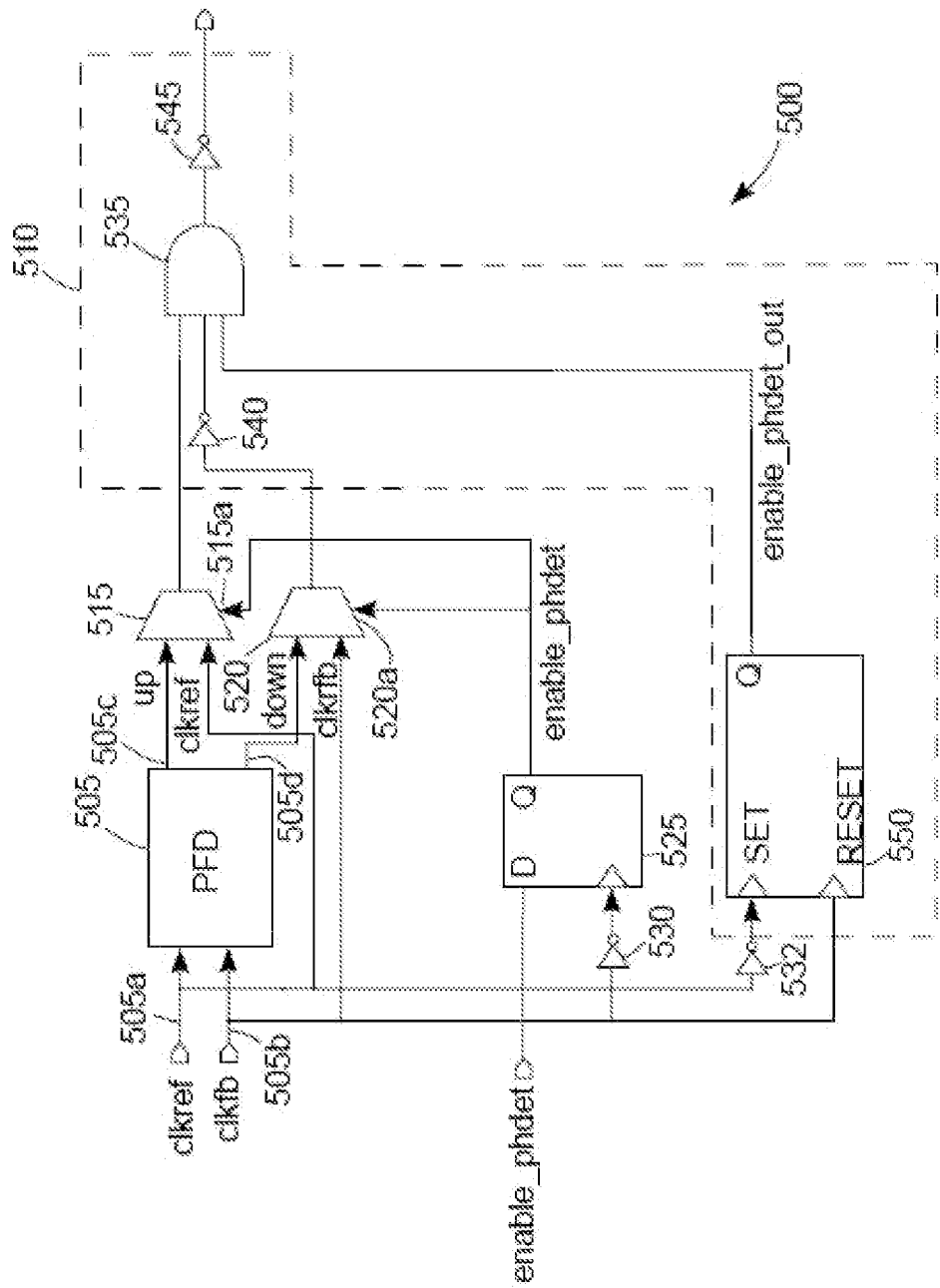
FIG. 5 is a simplified schematic a detection circuit, which includes a PFD and a phase detector according to one embodiment of the present invention.

FIG. 5 is a simplified schematic a detection circuit 500, which includes a PFD 505 and a phase detector 510 configured for use as a detection circuit in a PLL, such as a PLL configured for frequency synthesis. Phase detector 510 is generally indicated by the dashed line in FIG. 5. In addition to PFD 505 and phase detector 510, detection circuit 500 includes a reference clock multiplexer (mux) 515, a feedback clock mux 520, a flip flop 525, and an inverter 530. Phase detector 510 includes an AND gate 535, a first inverter 540, a second inverter 545. Phase detector 510 further includes an edge-triggered, set-reset flip flop 550 and an inverter 532 configured to invert the clock reference signal input into the set input of the edge-triggered, set reset flip flop.

PFD 505 includes a reference clock input 505a and a feedback clock input 505b respectively configured to receive a reference clock signal (e.g., from a crystal oscillator) and a feedback clock signal from a feedback loop of a PLL or the like. PFD 505 is configured to detect a phase difference and a frequency difference between the reference clock signal (labeled clkref in FIG. 5) and the feedback clock signal (labeled clkfb in FIG. 5). The PFD includes two outputs, an up output 505c and a down output 505d configured to output an up signal and a down signal, respectively. PFD 505 may be configured substantially similarly to PFD 205 described above with respect to FIG. 3.

According to one embodiment, reference clock mux 515 is configured to receive the up signal from the PFD, and feedback clock mux 520 is configured to be received the down signal from the PFD. Reference clock mux 515 is also configured to receive the reference clock signal, and the clock reference mux 220 is also configured to receive the feedback clock signal.

According to one embodiment, AND gate 535 is a three input AND gate. A first input of the AND gate is coupled to an output of the reference clock mux and a second input of the AND gate is coupled to an output of the feedback block mux. The first input of the AND gate is configured to receive an output signal of the reference clock mux, and the second input of the AND gate is configured to receive an inverted output signal (inverted by first inverter 540) from the feedback clock mux. More specifically, the reference clock mux is configured to pass either the up signal or the reference clock signal to the first input of the AND gate, and the feedback clock mux is configured to pass either the down signal or the feedback clock signal to the second input to the AND gate. A third input of the AND gate is coupled to an output of the edge-triggered, set-reset flip flop 550 and is configured to receive an output signal there from. The output of the edge-triggered, set-reset flip flop 540 is an enable phase-mode-detector signal (labeled enable_phdet_out in FIG. 5) for the AND gate. More specifically, the output of the edge-triggered, set-reset flip flop 540 is an enable phase-mode-detector signal for enabling a phase detector mode of operation of the AND gate and more generally to enable a phase detector mode of operation of phase detector 510. The phase detector mode of operation of the phase detector is described in further detail below. The logic function of the AND gate may generate a logic one state if the reference clock or the first pulse is one and the feedback clock signal is a logic state zero.

As described briefly above, the set input of the edge-triggered, set-reset flip flop 540 is configured to receive the inverted reference clock signal, and the reset input of the edge-triggered, set-reset flip flop is configured to receive the feedback clock signal. Further, flip flop 525 is configured to receive an enable phase detector signal (labeled enable_phdet in FIG. 5) and the inverted (inverted by inverter 530) feedback clock signal. The output of flip flop 525 is coupled to the select inputs 515*a* and 520*a* of both the reference clock mux and the feedback clock mux. If, for example, the output of flip flop 525 is set by the enable phase detector signal to one, then the reference clock mux is configured to pass the reference clock signal to the AND gate, and the feedback clock mux is configured to pass the feedback clock signal to the AND gate. If, for example, the output of flip flop 525 is zero by the enable phase detector signal, then the reference clock mux is configured to pass the up signal to the AND gate, and the feedback clock mux is configured to pass the down signal to the AND gate. More generally, the reference clock mux and the feedback clock mux may be configured as bypass circuits for allowing the reference clock signal and the feedback clock signal to bypass the PFD and be directed to the AND gate. The reference clock signal and the feedback clock signal may be configured to bypass the PFD if phase detector is in a phase detector mode of operation (i.e., the enable phase detector signal is one).

According to one embodiment, if the reference clock signal and the feedback clock signal are at different frequencies and out of phase, the PFD is selected for operation for bringing the reference clock signal and the feedback clock signal into phase. If the reference clock signal and the feedback clock signal become locked, the detector circuit is configured to stop use of the PFD and use the phase detector in a phase detector mode to maintain the lock. According to embodiments of the present invention, the reference clock signal and the feedback clock signal may be considered to be locked if the frequency of reference clock signal is approximately less than, or equal to, 0.1 percent different from the frequency of the feedback clock signal. Switching out the PFD and using the phase detector in a phase detector mode provide higher accuracy in tracking the phase difference of the reference clock signal and the feedback clock signal. Further, the PFD may be constructed as a relatively simple circuit and a low power circuit compared to traditional PFD circuits.

If the phase of the reference clock signal and the feedback clock signal become locked from an unlocked state, the enable phase-mode signal supplied to flip flop 525 is transitioned from zero (PFD mode of operation) to one (phase detector is in a phase detector mode of operation). The feedback clock signal is configured to clock flip flop 525 to clock the enable phase-mode signal through flip flop 525. The feedback clock signal clocks flip flop 525 on a falling edge due to inverter 530 inverting the feedback clock signal prior to passing the feedback clock signal to the flip flop. The enable phase-mode signal may be transitioned from zero to one by a PLL lock detector circuit (not shown), which is configured to detect whether the reference clock signal and the feedback clock signal become locked.

The enable phase-mode-detector signal supplied from the edge-triggered set-reset flip flop 540 to the AND gate, and the enable phase-mode signal supplied through flip flop 525 to the reference clock mux and the feedback clock mux, operate together to put detector circuit 500 in the phase detector mode of operation. The enable phase-mode-detector signal supplied from the edge-triggered, set-reset flip flop 540 is generally a delayed version of the enable phase-mode signal supplied through flip flop 525. The enable phase-mode-detector signal supplied from the edge-triggered, set-reset flip flop 540 is delayed from enable phase-mode signal supplied through flip flop 525 so that fewer circuits are transitioning at the same time while the detector circuit transitions from the PFD mode to the phase detector mode. Various delays may be used in the detector circuit or a PLL including detector circuit 500 to delay the enable phase-mode detector signal.

Figure 6:
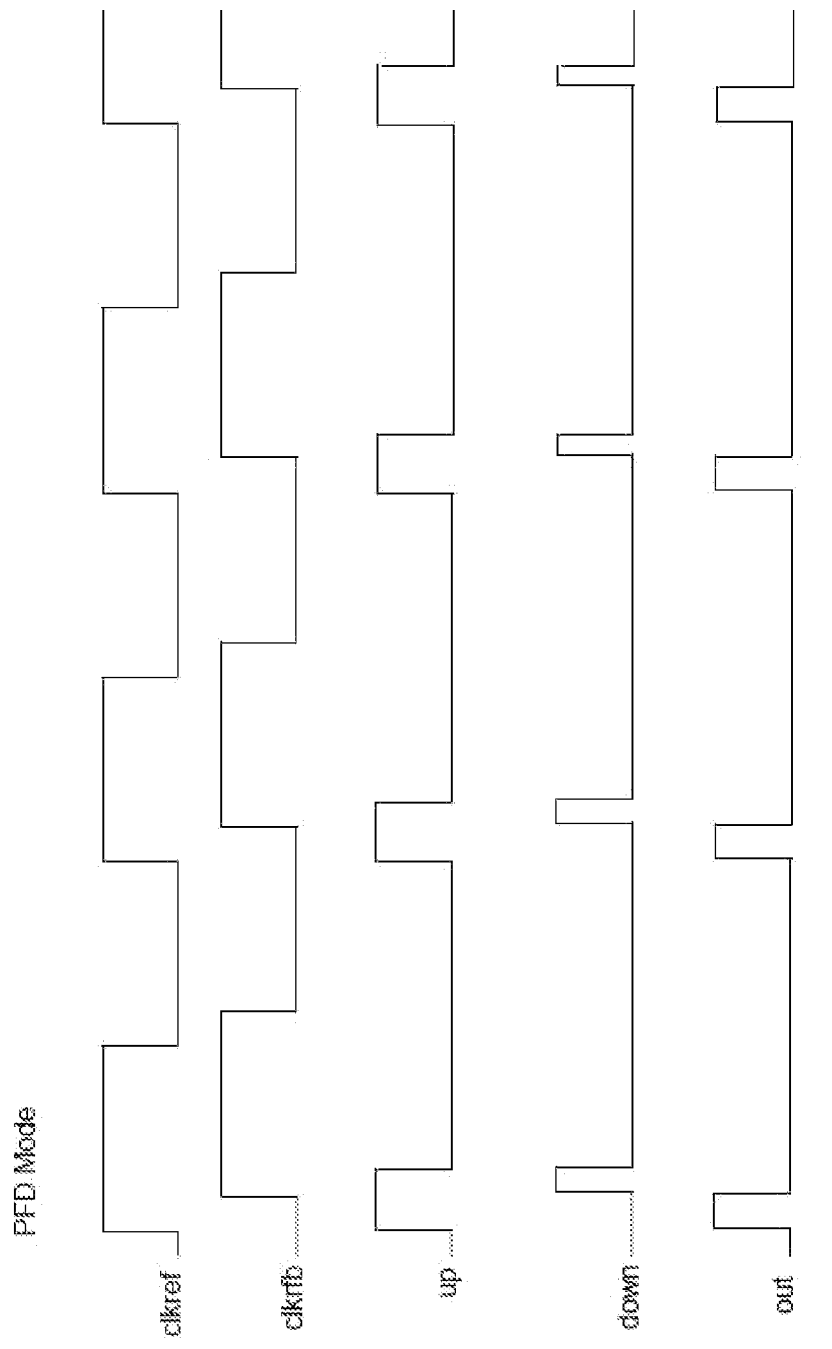
FIG. 6 is a simplified timing diagram of the detector circuit operating in the PFD mode.

FIG. 6 is a simplified timing diagram of detector circuit 500 operating in the PFD mode. As described above, the PFD mode of operation is selected if the frequency of the reference clock signal and the feedback clock signal differ by more than 0.1 percent. The timing diagram includes the reference clock signal labeled clkref, the feedback clock signal labeled clkfb, the up signal labeled up, the down signal labeled down, and the output signal of detector circuit 500. The up signal is derived from the reference clock signal via the PFD, and the down signal is derived from the feedback clock signal via the PFD as described above with respect to FIGS. 3 and 4A.

The output signal of phase detector 500 includes phase-difference information of the rising edge of the up signal and the rising edge of the down signal where the up signal and the down signal are subject to the logical operation of the first inverter 540, the AND gate 535, and the second inverter 545. The logical operation of the first inverter 540, the AND gate 535, and the second inverter 545 on the up signal and the down signal may be expressed as: (up signal) AND !(down signal). Other logical combinations may be used to extract the phase difference between the rising edge of the up signal and the rising edge of the down signal.

It is noted that the output signal from detector circuit 500 is further controlled by the third input (the enable phase-detector-mode signal) of the AND gate. More specifically, the output signal is controlled by the AND gate being forced low or high by the set signal and the reset signal of the edge-triggered set-reset flip flop 540, which is forced to set or reset via the reference clock signal and the feedback clock signal. In a locked mode of a PLL in which the detector circuit is configured to operate, the rising edge of the feedback clock signal arrives after the rising edge of the reference clock signal. The third input of the AND gate is forced to one (set signal from the edge-triggered set-reset flip flop 540) if the logical combination of the reference clock signal (i.e., up signal) and the inverse of the feedback clock signal (i.e., down signal) is one. As a logical expression, the foregoing may be expressed as: (reference clock signal) AND !(feedback clock signal)=1, where "!" is an inversion expression as is well known by those of skill in the art.

Figure 7:
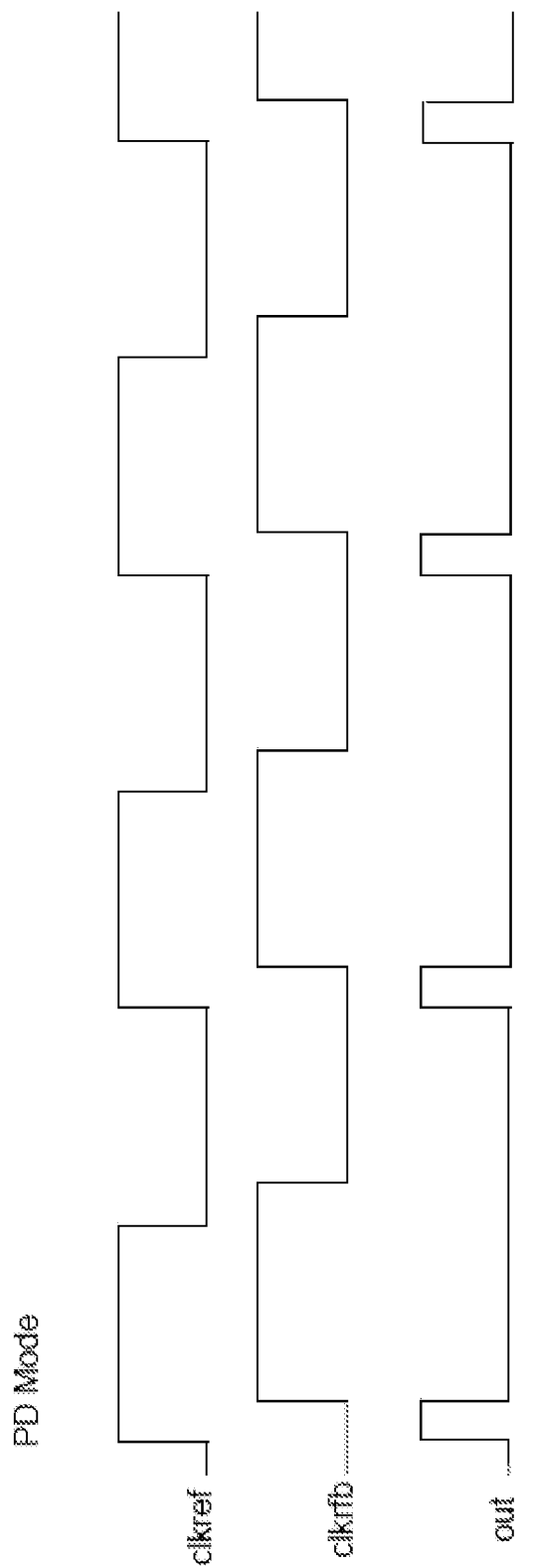
FIG. 7 is a simplified timing diagram of the detector circuit operating in the phase detector mode of operation.

FIG. 7 is a simplified timing diagram of the detector circuit operating in the phase detector mode of operation, for example, as the phase of the reference clock signal and the feedback clock signal are locked in a PLL in which the detector circuit is operating. As described above, the phase detector mode of operation is selected if the frequency of the reference clock signal and the feedback clock signal differ by 0.1 percent, or less then 0.1 percent. The timing diagram of FIG. 7 includes the reference clock signal labeled clkref, the feedback clock signal labeled clkfb, and the output signal of the detector circuit. As described briefly above, in the phase detector mode of operation, the PFD is forced to be bypassed by the phase detector-mode signal controlling the reference clock mux and the feedback clock mux. The first inverter 540, the AND gate 535, and the second inverter 545 are configured to perform a logical operation on the reference clock signal (instead of the up signal) and the feedback clock signal (instead of the down signal) to provide an output signal, which includes phase difference information of the reference clock signal and the feedback clock signal. More specifically, the first inverter 540, the AND gate 535, and the second inverter 545 perform the logical operation of "ANDing" the reference clock signal with the inverse feedback clock signal to extract the phase difference between the reference clock signal and the feedback clock signal. As a logical expression, the foregoing may be expressed as: (reference clock signal) AND !(feedback clock signal).

Figure 8:
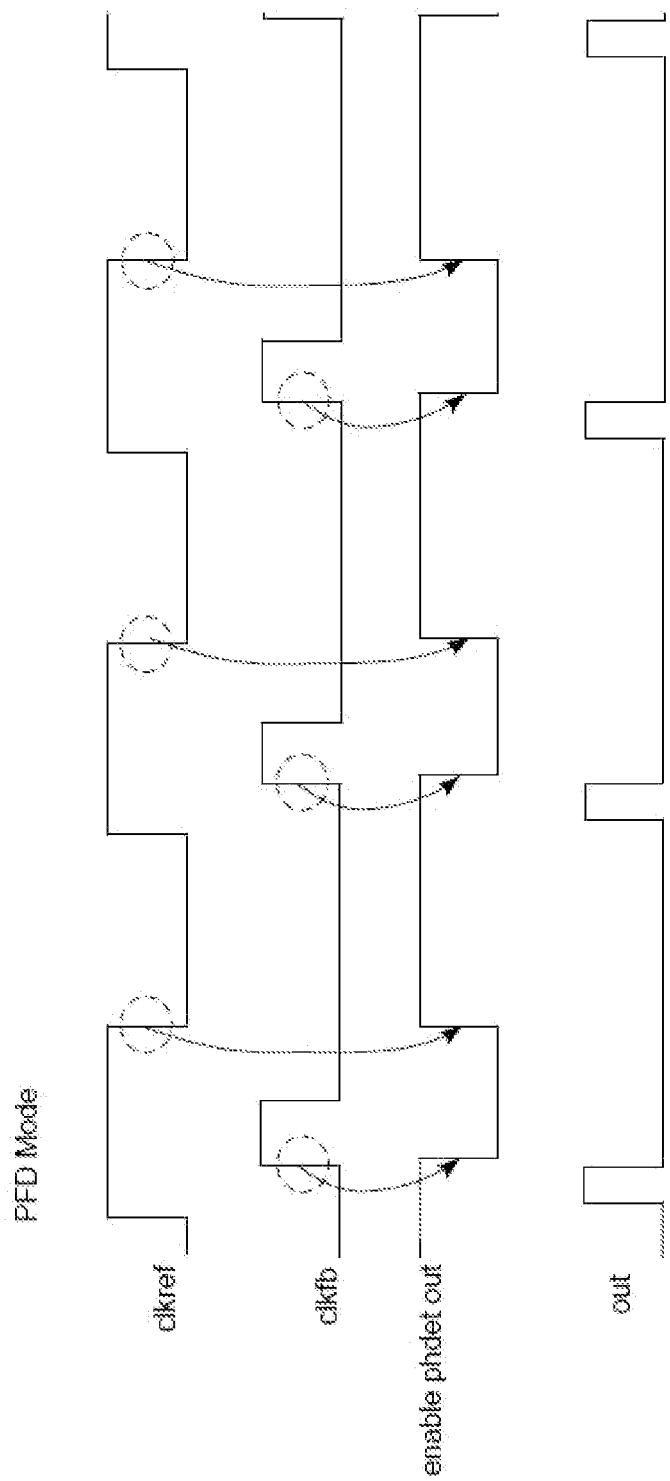
FIG. 8 is a simplified timing diagram of the reference clock signal (labeled clkref), the feedback clock signal (labeled clkfb), the enable phase-detector-mode signal (labeled enable_phdet_out), and the output signal.

According to one embodiment of the present invention where detector circuit 500 is included in a PLL, such as PLL 200 shown in FIG. 2, divider 125 may generate a relatively low-duty cycle feedback clock signal and the falling edge of the feedback clock signal may jitter. Similarly, the falling edge of the reference clock signal may jitter. The enable phase-detector-mode signal may be configured to remove from the output signal of the phase detector the logical combination of falling edges of the reference clock signal and the feedback clock signal. FIG. 8 is a simplified timing diagram of the reference clock signal (labeled clkref), the feedback clock signal (labeled clkfb), the enable phase-detector-mode signal (labeled enable_phdet_out), and the output signal. As is shown in the simplified timing diagram, the phase different between the rising edges of the reference clock signal and the feedback clock signal is passed to the output signal of the phase detector by the AND gate if the enable phase-detector-mode signal goes high. As is further shown in the simplified timing diagram, after the first inverter 540, the AND gate 535, and the second inverter 545 perform a logical operation on the reference clock signal and the feedback clock signal to extract the phase different from the reference clock signal and the feedback clock signal, the enable phase-detector-mode signal goes low to force the output of the AND gate low. The enable phase-detector-mode signal is set to high at the falling edge of the reference clock signal, and is reset to low at the rising edge of the feedback clock signal (i.e., both the reference clock signal and feedback clock signal are high and the phase information has already been extracted).

Figure 9:
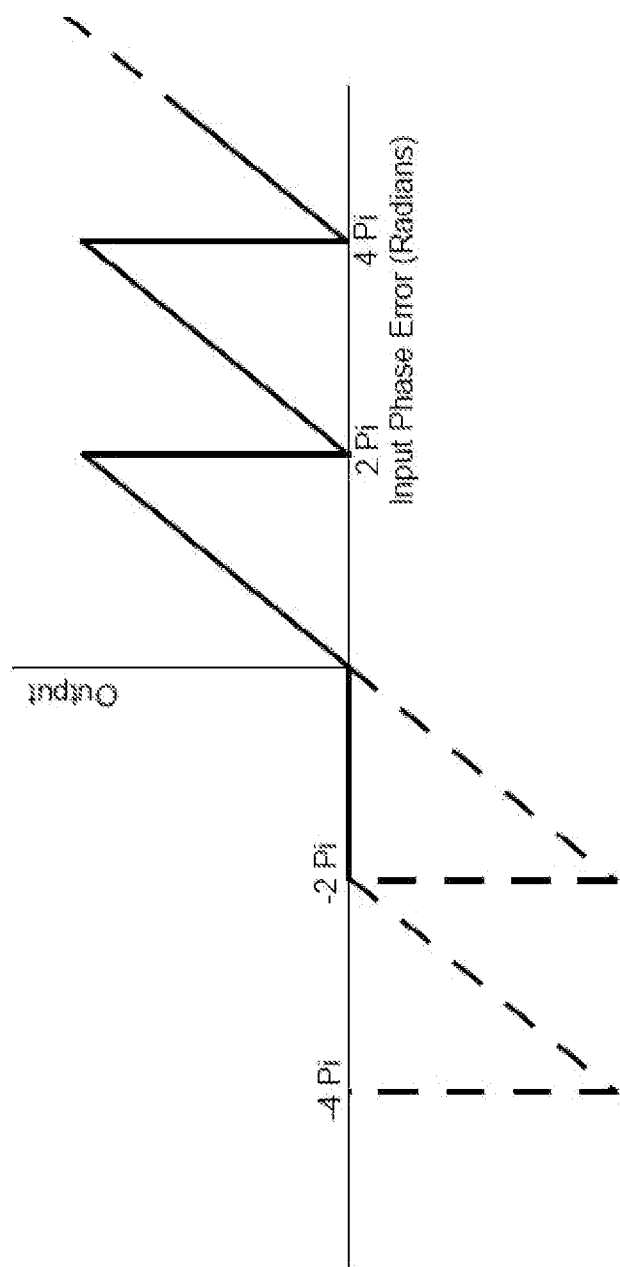
FIG. 9 is a simplified phase error diagram of the phase difference (also sometimes referred to as phase error) between the reference clock signal and the feedback clock signal (horizontal axis) and the phase difference (output) reported by the PFD.
Figure 10:
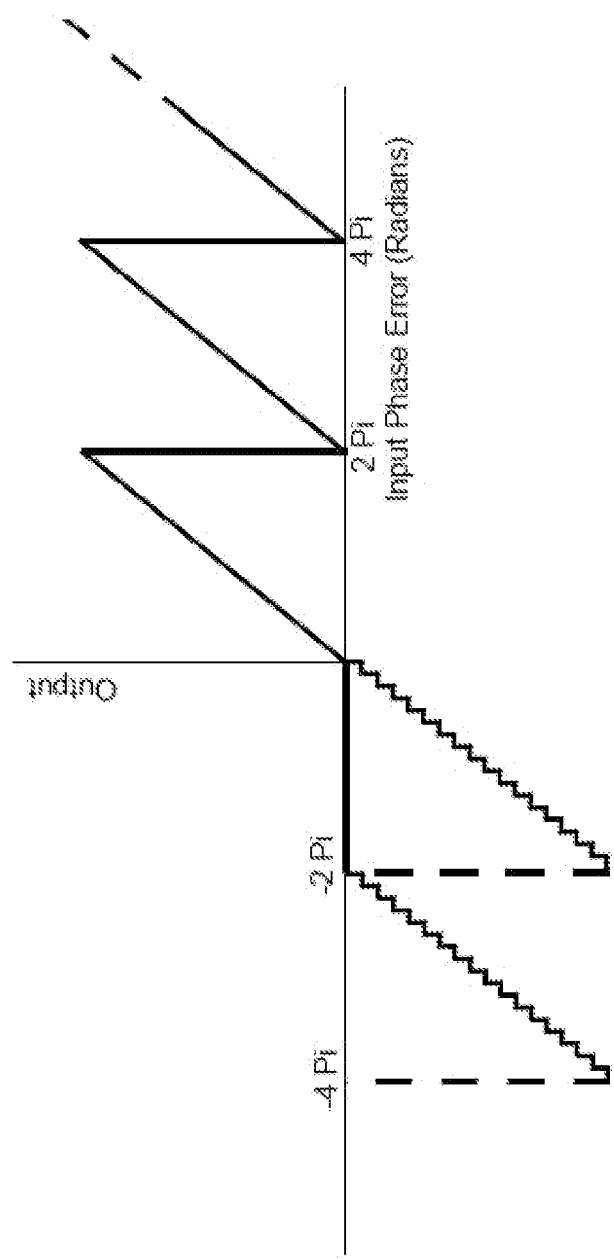
FIG. 10 is a simplified timing schematic of a phase error and pseudo phase error reported by a coarse TDC to the VCO.

The PFD embodiments described herein rectifies the negative phase error of the reference clock signal and the feedback clock signal to zero. FIG. 9 is a simplified phase error diagram of the phase difference (also sometimes referred to as phase error) between the reference clock signal and the feedback clock signal (horizontal axis) and the phase difference (output) reported by the PFD. A typical PFD is configured to generate an output signal for the negative phase difference, which is represented by the dashed line to the left of the vertical axis. While the negative phase error is not transmitted to a VCO from PFD 505, a PLL (e.g., PLL 200) including PFD 505 is able to lock the phases of the reference clock signal and the feedback clock signal. By not providing for the report of the negative phase error, the PFD circuit may be simplified and may be configure to be smaller, and consume relatively less power, than a traditional PFD. Locking of the phases might be delayed as compared to a traditional PFD. According to one embodiment, a coarse TDC may be configured to assist locking PLL, which includes PFD 505. Specifically, a divided clock signal may be sample from the divider, where the divided clock signal has a higher frequency than the reference clock signal, and may be provided to the coarse TDC to provide a pseudo negative phase error to the VCO. FIG. 10 is a simplified timing schematic of a phase error and pseudo phase error reported by a coarse TDC to the VCO. The coarse TDC may be configured to be powered down after the phase is locked.

Figure 11:
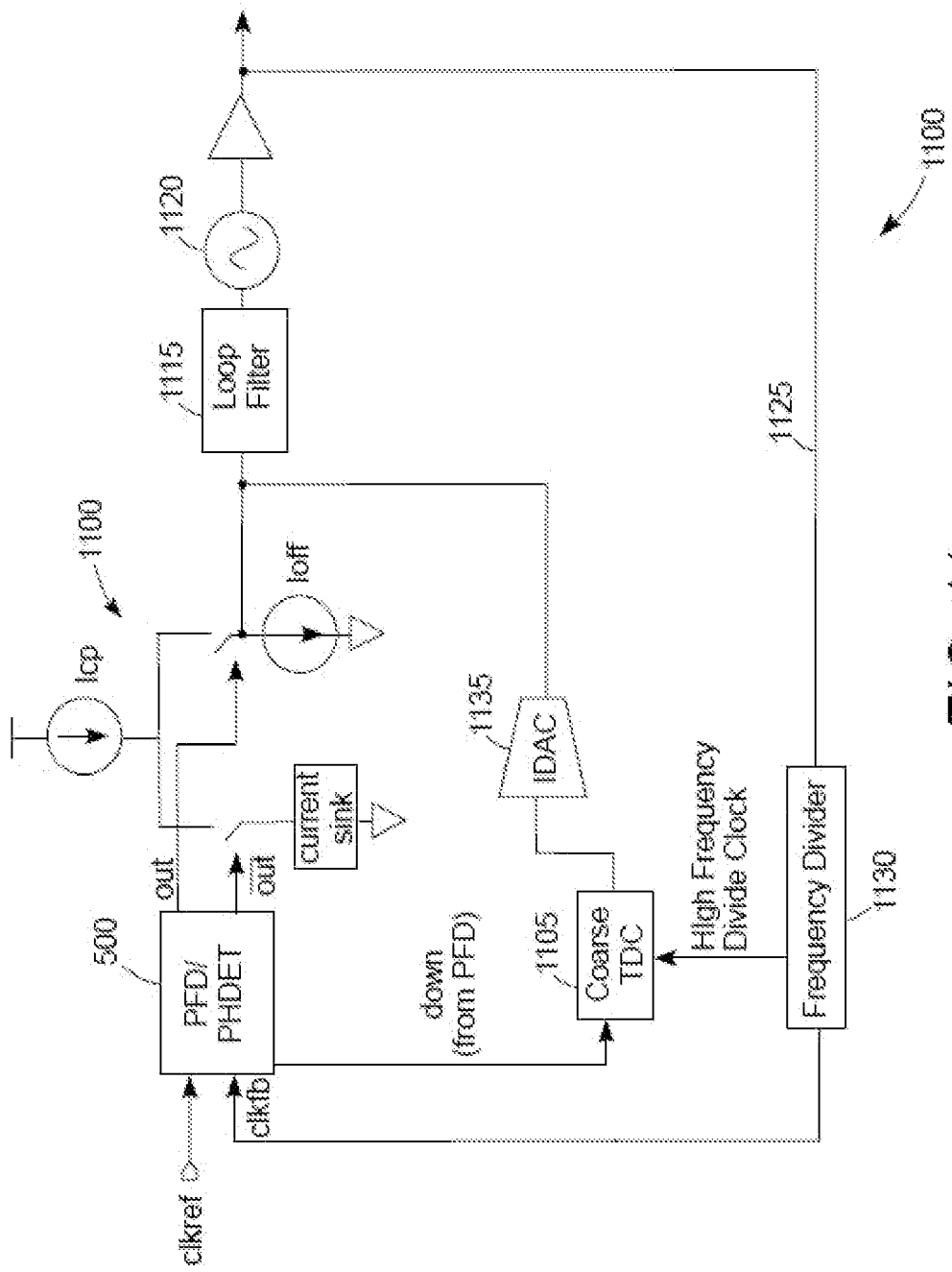
FIG. 11 is a simplified schematic of a charge pump PLL according to one embodiment of the present invention.

FIG. 11 is a simplified schematic of a charge pump PLL 1100 according to one embodiment of the present invention. PLL 1100 may include detector circuit 500 and may include a coarse TDC 1105. PLL 1100 may also include a charge pump 1110, a loop filter 1115, a VCO 1120, a feedback circuit path 1125 with a divider 1130 in the feedback circuit path. According to one embodiment, the coarse TDC may be configured to collect a divided feedback clock signal from the divider and may be configured to collect the down signal from the PFD of detector circuit 500 to generate a digital signal that represents a coarse phase difference (see FIG. 10) between the reference clock signal and the divided clock signal. The digital signal from the TDC may be directed through a current digital to analog converter (IDAC) 1135 where the current signal from the IDAC is combined with the phase error signal from the charge pump to tune the VCO.

Figure 12:
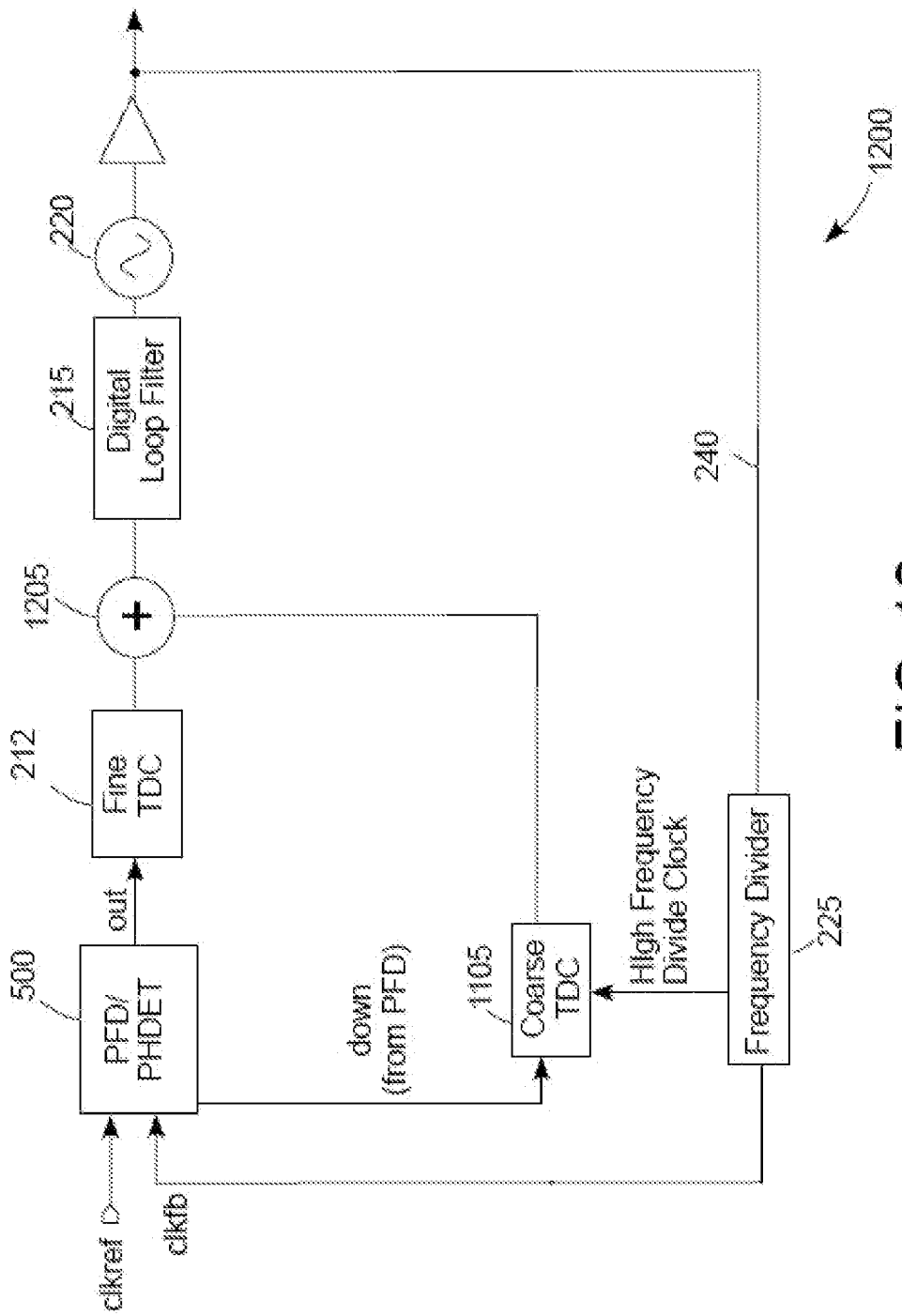
FIG. 12 is a simplified schematic of an all digital PLL (ADPLL) according to one embodiment of the present invention.

FIG. 12 is a simplified schematic of an all digital PLL (ADPLL) 1200 according to one embodiment of the present invention. ADPLL 1200 may include detector circuit 500 and may include coarse TDC 1105. ADPLL 1200 may also include TDC 212 (which may be a fine TDC), filter circuit 215 (which may be a digital loop filter), VCO 220 (which may be a digital VCO) 220, and feedback circuit path 240 with a divider 225 in the feedback circuit path. As described above, the coarse TDC may be configured to collect a divided feedback clock signal from the divider and may be configured to collect the down signal from the PFD of detector circuit 500 to generate a digital signal the represents a coarse phase difference between the reference clock signal and the divided clock signal. The digital signal from the coarse TDC may be directed through an adder 1205 configured to add the phase difference signals from the coarse TDC 1105 and TDC 212 to tune the VCO. As described above, the coarse TDC may be powered down after ADPLL 1200 is locked.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations, and equivalents may be employed without departing from the scope of the invention as defined by the claims.

What is claimed is:

1. A phase locked loop comprises:
a phase frequency detector (PFD) configured to: receive a reference clock signal and a feedback clock signal, output a first signal, which includes first phase information for a rising edge of the reference clock signal, and a second signal, which includes second phase information for a rising edge of the feedback clock signal;
a logic gate including an AND gate with an inverted input and a non-inverted input, wherein one of the first signal or the second signal from the PFD is coupled to the inverted input and the other signal is coupled to the non-inverted input, wherein the AND gate is configured to logically combine the first signal and the second signal to produce a pulse signal having a rising edge, which includes the first phase information, and a falling edge, which includes the second phase information;
a time to digital converter (TDC) coupled the logic gate wherein the pulse signal output from the AND gate is input to the TDC, and wherein the TDC is configured to generate a digital timing signal, which includes timing information for a phase difference of the first and the second phase information; and
a controlled oscillator coupled to the TDC and configured to vary or maintain a frequency of the feedback clock signal from the digital timing signal.

2. The PLL of claim 1, wherein the controlled oscillator is a current controlled oscillator.

3. The PLL of claim 1, wherein the controlled oscillator is a voltage controlled oscillator.

4. The PLL of claim 1, wherein the controlled oscillator is a digital controlled oscillator.

5. The PLL of claim 1, further comprises a feedback loop configured to transfer the feedback clock signal varied or maintained by the controlled oscillator to the PFD.

6. The PLL of claim 5, wherein the feedback loop includes a frequency divider configured to frequency device the feedback clock signal, and the PFD is configured to receive the feedback clock signal from the divider.

7. The PLL of claim 1, wherein the pulse signal output from the AND gate is input to the TDC as an enable signal for the TDC.

8. The PLL of claim 7, wherein an input of the inverter is configured to receive the reference clock signal.

9. The PLL of claim 7, wherein a first input of the AND gate is configured to receive the reference clock signal an output of the inverter is coupled to a second input of the AND gate.

10. The PLL of claim 7, wherein a logic function of the logic gate generates a logic one signal if the reference clock signal is a logic one signal and the feedback clock signal is a logic zero signal, otherwise the logic function generates a logic zero signal.

11. The PLL of claim 4, wherein the falling edges of the first signal and the second signal include jitter.

12. The apparatus of claim 1, wherein the PFD further includes an AND gate configured to perform the logical combination of the first signal and the second signal.

13. A phased locked loop (PLL) comprises:
a phase frequency detector (PFD) configured to: receive a reference clock signal and a feedback clock signal, output a first signal, which includes first phase information for a rising edge of the reference clock signal, and a second signal, which includes second phase information for a rising edge of the feedback clock signal;
first multiplexer configured to receive the reference clock signal and receive the first signal from the PFD;
a second multiplexer configured to receive the feedback clock signal and receive the second signal from the PFD;
a control gate configured to control the first multiplexer and the second multiplexer to pass the reference clock signal and the feedback clock signal or pass the first signal and the second signal;
a logic gate configured to receive either the reference clock signal and the feedback clock signal if the PLL is not locked or receive the first signal and the second signal from the first multiplexer and the second multiplexer if the PLL is locked, wherein:
the logic gate is configured to perform a logical function on either reference clock signal and the feedback clock signal to generate a first pulse or the first signal and the second signal to generate a second pulse,
the first pulse includes first phase difference information for the phase difference between the reference clock signal and the feedback clock signal, and
the second pulse includes second phase difference information for the phase difference between the first phase information and the second phase information.

14. The PLL of claim 13, wherein the logical function is a AND function.

15. The PLL of claim 13, wherein the logical function generates a logic one state if the reference clock or the first pulse is one and the feedback clock signal is a logic state zero.

16. The PLL of claim 13, wherein the logic gate includes an inverter and an AND gate configured to perform the logical function.

17. The PLL of claim 13, wherein an input of the inverter is configured to receive the feedback clock signal or the first pulse.

18. The PLL of claim 13, wherein a first input of the AND gate is configured to receive the reference clock signal or the second pulse.

19. The PLL of claim 13, wherein an output of the inverter is coupled to a second input of the AND gate.

20. The PLL of claim 13, wherein the inverter is configured to invert the reference clock signal or the second signal prior to transferring the reference clock signal or the second signal prior to a first input of the AND gate, and a second input of the AND gate is configured to receive either the reference clock signal or the first signal, and perform an AND function on either the reference clock signal and the feedback clock signal or the first signal and the second signal.

21. The PLL of claim 13, wherein the control gate is a flip flop and is configured to transfer a control signal to the first mux and the second mux on a falling edge of the feedback clock signal to control.

22. The PLL of claim 21, further comprises a phase lock detector configured to determine if the PLL is locked and set the control signal to a first control state if the PLL is locked and set the control signal to a second control signal is the PLL is not locked, wherein:
the first multiplexer and the second multiplexer are configured to receive the control signal in the first state to pass the first signal and the second signal to the logic gate, and
the first multiplexer and the second multiplexer are configured to receive the control signal in the second state to pass the reference clock signal and the feedback clock signal to the logic gate.

23. The PLL of claim 22, wherein the first multiplexer and the second multiplexer are configured as bypass circuits for the PFD with the control signal in the first state.

24. The PLL of claim 13, further comprises an edge-triggered, set-reset flip flop and an inverter coupled to a set input of the an edge-triggered, set-reset flip flop, wherein the an edge-triggered, set-reset flip flop is configured to be set and reset and transfer a set signal or a reset signal to the logic gate to either allow logical combinations or force an output of the logic gate low to remove from the output phase information for the logical combination of the reference clock signal and the feedback clock or for the logical combination of the first signal and the second signal.

25. The PLL of claim 24, wherein the phase information removed is for the falling edges of the reference clock signal and the feedback clock or for the falling edges of first signal and the second signal.

26. The PLL of claim 13, wherein the PFD is configured to rectify negative phase information passed from the logic gate.

27. The PLL of claim 26, further comprises a coarse time to digital converter (TDC) to add negative phase information for the logic gate.

28. The PLL of claim 27, wherein the coarse TDC is configured to be turned off if the PLL is locked.

29. The PLL of claim 27, further comprises:
a fine TDC coupled to the PFD; and
an adder configured to combine output from the coarse TDC and the fine TDC to add positive phase information from the fine TDC and negative phase information from the coarse TDC.

* * * * *